(12) United States Patent
Yamamoto et al.

(10) Patent No.: US 8,493,073 B2
(45) Date of Patent: Jul. 23, 2013

(54) INSULATION RESISTANCE DETECTING APPARATUS

(75) Inventors: Susumu Yamamoto, Makinohara (JP); Satoshi Ishikawa, Makinohara (JP)

(73) Assignee: Yazaki Corporation, Tokyo (JP)

( * ) Notice: Subject to any disclaimer, the term of this patent is extended or adjusted under 35 U.S.C. 154(b) by 376 days.

(21) Appl. No.: 12/797,143

(22) Filed: Jun. 9, 2010

(65) Prior Publication Data

US 2010/0315096 A1    Dec. 16, 2010

(30) Foreign Application Priority Data

Jun. 10, 2009  (JP) ................. P2009-139228

(51) Int. Cl.
    *G01R 31/02* (2006.01)
(52) U.S. Cl.
    USPC .......................................... 324/551; 324/541
(58) Field of Classification Search
    USPC ................ 324/541, 503, 509, 527, 551, 705, 324/557; 361/42, 47
    See application file for complete search history.

(56) References Cited

U.S. PATENT DOCUMENTS

| | | | |
|---|---|---|---|
| 4,214,311 A * | 7/1980 | Nakashima et al. ............ 702/65 |
| 5,073,920 A * | 12/1991 | Masukawa et al. ............. 379/30 |
| 5,101,160 A * | 3/1992 | Barjonnet et al. ............. 324/510 |
| 5,303,164 A * | 4/1994 | Masson et al. ................... 702/65 |
| 6,392,422 B1 * | 5/2002 | Kammer et al. ................ 324/650 |
| 7,317,316 B2 * | 1/2008 | Leitz ............................. 324/551 |
| 2005/0073317 A1 * | 4/2005 | Yamamoto et al. ........... 324/503 |
| 2005/0073320 A1 * | 4/2005 | Yamamoto et al. ........... 324/557 |
| 2007/0132459 A1 * | 6/2007 | Yamamoto et al. ........... 324/541 |
| 2007/0210805 A1 * | 9/2007 | Kawamura .................... 324/541 |
| 2009/0153156 A1 * | 6/2009 | Ishii .............................. 324/704 |

FOREIGN PATENT DOCUMENTS

JP    2007-163141    6/2007

* cited by examiner

*Primary Examiner* — Hoai-An D Nguyen
(74) *Attorney, Agent, or Firm* — Finnegan, Henderson, Farabow, Garrett & Dunner, L.L.P.

(57) ABSTRACT

An insulation resistance detecting apparatus is provided to detect an insulation resistance of a load circuit. The insulation resistance detecting apparatus includes a coupling capacitor of which a first end is connected to the load circuit; a periodic waveform output section which is connected to a second end of the coupling capacitor, and outputs a periodic waveform to the second end; a waveform shaping section which extracts and amplifies a part of the periodic waveform including a peak point; and an arithmetic operation section which determines the insulation resistance of the load circuit on the basis of a first wave height as a wave height value of a waveform outputted from the waveform shaping section and a second wave height value as a wave height value of the periodic waveform.

8 Claims, 6 Drawing Sheets

FIG.3A
FIG.3B
FIG.3C
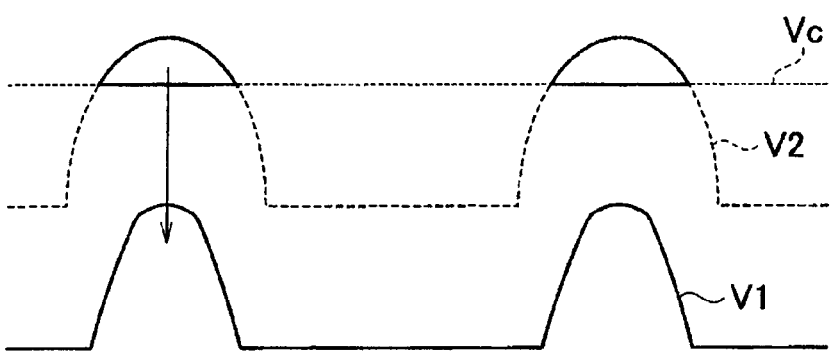
FIG.4
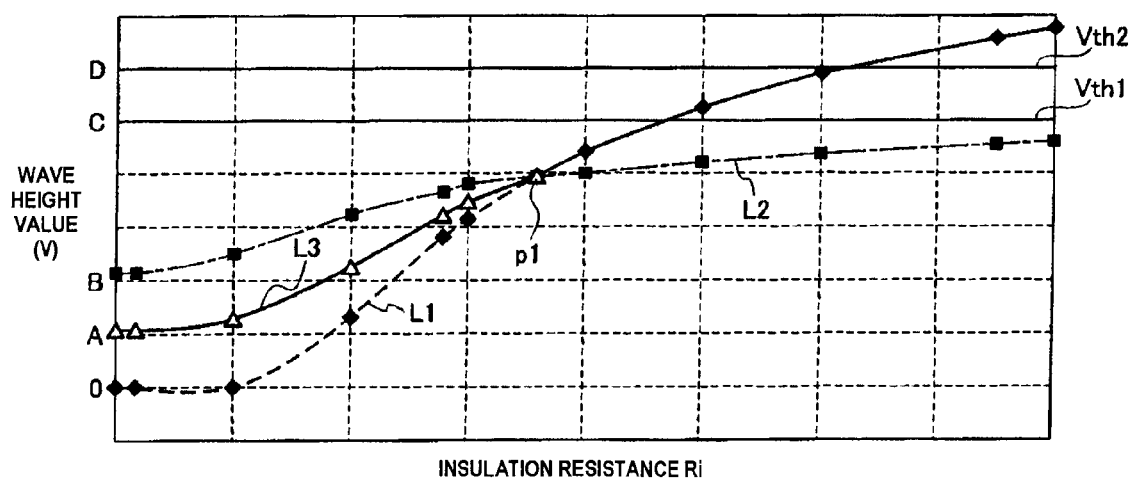

INSULATION RESISTANCE DETECTING APPARATUS

BACKGROUND OF THE INVENTION

1. Technical Field

The present invention relates to an insulation resistance detecting apparatus for detecting a reduction when an insulation resistance of a load circuit is reduced due to electric leakage or the like.

2. Background Art

For example, in a motor drive circuit (hereinbelow referred to as a "load circuit") provided in an electric vehicle and a hybrid vehicle, a high-voltage direct current power source is provided, power outputted from the direct current power source is converted to three-phase alternating current power, and the three-phase alternating current power is supplied to the motor to thereby drive the motor.

In the load circuit described above, an insulation resistance detecting apparatus (see, e.g., JP-A-2007-163141) is provided in order to prevent electric leakage and, when the insulation resistance of the load circuit is reduced due to the occurrence of the electric leakage, an alarm is issued to immediately notify a user of the occurrence of the electric leakage.

FIG. 6 is a circuit diagram showing a structure when an insulation resistance detecting apparatus 50 is connected to a load circuit 10 in a conventional case. As shown in FIG. 6, the insulation resistance detecting apparatus 50 includes a coupling capacitor C1, a rectangular wave generating circuit 51, a self-diagnosis circuit 52, a filter 53, a waveform shaping circuit 54, and a microcomputer 55. One end of the coupling capacitor C1 is connected to a point P1 as one output terminal of a direct current power source B provided in the load circuit 10, while the other end thereof is connected to a point P2 as an output terminal of the rectangular wave generating circuit 51.

When a rectangular wave is outputted from the rectangular wave generating circuit 51, the waveform of the rectangular wave is transformed into a sinusoidal waveform in the filter 53, and is further shaped into a waveform in which a region in the vicinity of a peak point is enlarged in the waveform shaping circuit 54. A wave height value of a waveform of a signal outputted from the waveform shaping circuit 54 (hereinbelow referred to as a reference signal V1) changes in accordance with the magnitude of an insulation resistance Ri. Specifically, when the insulation resistance Ri is large (normal case), the voltage at the point P2 is high so that the wave height value of the reference signal V1 is high. On the other hand, when the insulation resistance Ri is reduced due to the occurrence of the electric leakage in the load circuit 10, the voltage at the point P2 is reduced so that the wave height value of the reference signal V1 is reduced.

A curve L1 shown in FIG. 7 is a characteristic view showing a relationship between the insulation resistance Ri and the wave height value of the reference signal V1, and the microcomputer 55 determines the insulation resistance Ri of the load circuit 10 on the basis of the reference signal V1 outputted from the waveform shaping circuit 54. Herein, as seen from the curve L1, when the electric leakage does not occur in the load circuit 10, and the insulation resistance Ri of the load circuit 10 is large, the wave height value of the reference signal V1 is large; when the insulation resistance Ri is reduced, the wave height value of the reference signal V1 is sharply reduced; and when the insulation resistance Ri reaches the vicinity of a zero point, the wave height value of the reference signal V1 becomes almost zero.

Subsequently, when the wave height value of the reference signal V1 is reduced to be less than a predetermined threshold value, the microcomputer 55 can determine that the insulation resistance of the load circuit 10 is reduced, and issue an alarm or the like to notify the user of the reduction.

In the conventional insulation resistance detecting apparatus 50 described above, when a short circuit trouble occurs in the load circuit 10, and the insulation resistance Ri is reduced to be in the vicinity of zero, the wave height value becomes almost zero. On the other hand, when the short circuit fault occurs in the insulation resistance detecting apparatus 50 itself, the wave height value detected by the microcomputer 55 similarly becomes almost zero. That is, when the microcomputer 55 detects that the wave height value is zero, there is a case where it is not possible to discern whether the short circuit trouble is occurring in the load circuit 10 or the short circuit fault is occurring in the insulation resistance detecting apparatus 50 itself.

Consequently, in the conventional insulation resistance detecting apparatus 50, when an ignition is turned on, the self-diagnosis circuit 52 is operated to perform a process for determining whether or not the fault is occurring in the entire apparatus. Specifically, when the ignition is turned on, the microcomputer 55 shown in FIG. 6 outputs a forced electric leakage signal to turn on the self-diagnosis circuit 52, whereby the voltage at the point P2 is reduced to a certain level, and the situation in which the electric leakage is occurring in the load circuit 10 is artificially produced. Subsequently, when the microcomputer 55 detects a reduction in the insulation resistance Ri, it is determined that the insulation resistance detecting apparatus 50 is normally operated.

However, the self-diagnosis circuit 52 mentioned above has a drawback that the fault determination is performed only when the ignition is turned on, but the fault can not be detected in a case where the fault occurs in the insulation resistance detecting apparatus 50 after the ignition is turned on.

SUMMARY OF THE INVENTION

Accordingly, the present invention has been achieved to solve the conventional problem described above, and an object thereof is to provide an insulation resistance detecting apparatus capable of discerning between the reduction in the insulation resistance and the apparatus fault.

In order to achieve the above object, there is provided an insulation resistance detecting apparatus for detecting an insulation resistance of a load circuit, the apparatus comprising: a coupling capacitor of which a first end is connected to the load circuit; a periodic waveform output section which is connected to a second end of the coupling capacitor, and outputs a periodic waveform to the second end; a waveform shaping section which extracts and amplifies a part of the periodic waveform including a peak point; and an arithmetic operation section which determines the insulation resistance of the load circuit on the basis of a first wave height value as a wave height value of a waveform outputted from the waveform shaping section and a second wave height value as a wave height value of the periodic waveform.

As a result, it is possible to reliably detect the apparatus fault which occurs when the insulation resistance detecting apparatus is driven, and omit the conventionally used self-diagnosis circuit.

BRIEF DESCRIPTION OF THE DRAWINGS

In the accompanying drawings:

FIG. 3A to 3C are characteristic views showing waveforms of the standard signal and the reference signal according to the embodiment of the present invention;

FIG. 4 is a characteristic view showing the relationship between an average value and wave height values of the reference signal and the standard signal according to the embodiment of the present invention;

DETAILED DESCRIPTION OF THE EXEMPLARY EMBODIMENTS

Figure 1:
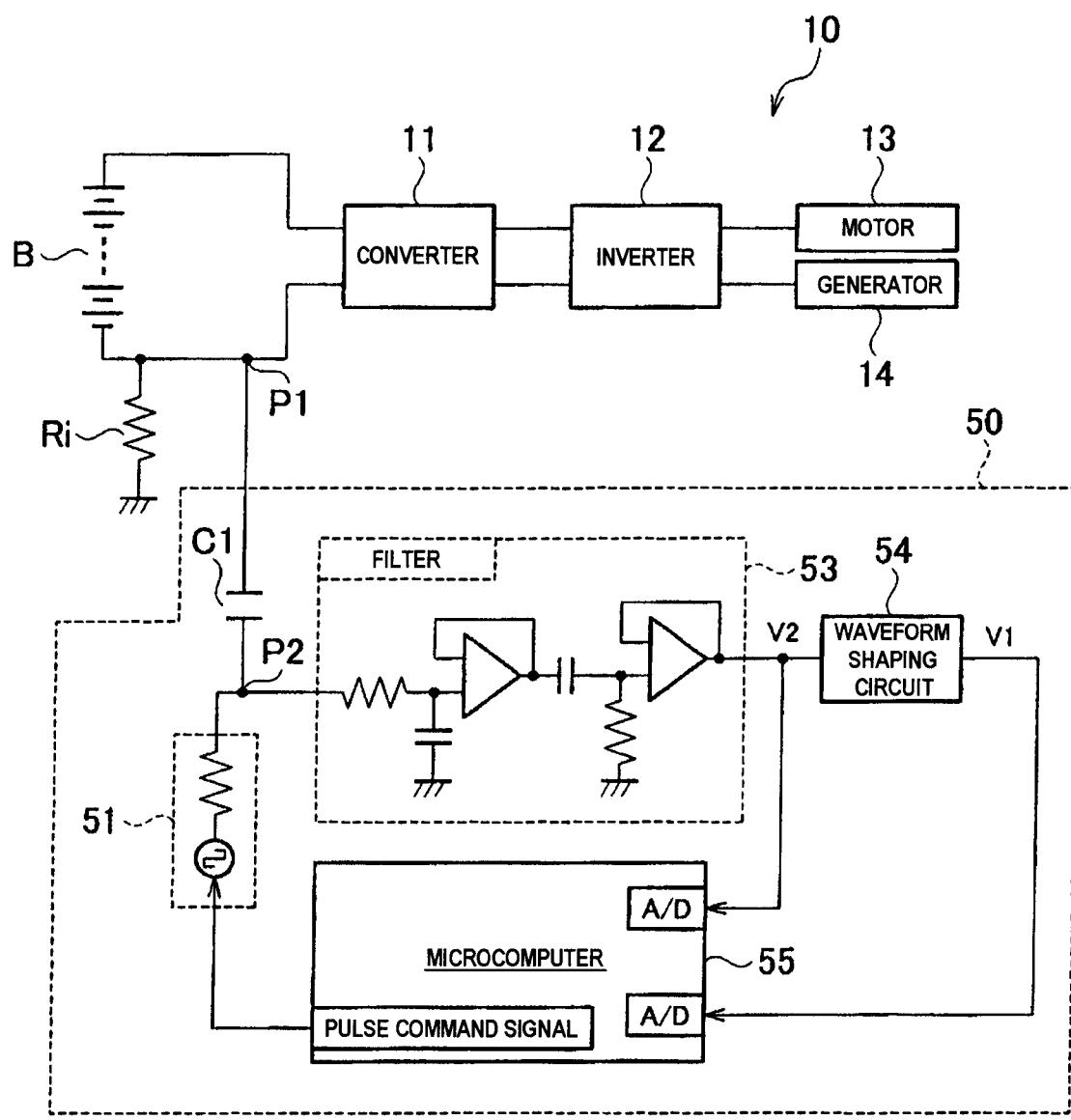
FIG. 1 is a circuit diagram showing a structure when an insulation resistance detecting apparatus according to an embodiment of the present invention is connected to a load circuit.

A first aspect of the present invention provides an insulation resistance detecting apparatus for detecting an insulation resistance of a load circuit, the apparatus comprising: a coupling capacitor of which a first end is connected to the load circuit; a periodic waveform output section which is connected to a second end of the coupling capacitor, and outputs a periodic waveform to the second end; a waveform shaping section which extracts and amplifies a part of the periodic waveform including a peak point; and an arithmetic operation section which determines the insulation resistance of the load circuit on the basis of a first wave height value as a wave height value of a waveform outputted from the waveform shaping section and a second wave height value as a wave height value of the periodic waveform.

The insulation resistance detecting apparatus in a second aspect of the present invention may be configured in that, when the first wave height value is smaller than a given threshold value, the arithmetic operation section determines the insulation resistance on the basis of an average value of the first and second wave height values.

The insulation resistance detecting apparatus in a third aspect of the present invention may be configured in that, when the first wave height value is smaller than the second wave height value, the arithmetic operation section determines the insulation resistance on the basis of an average value of the first and second wave height values.

The insulation resistance detecting apparatus in a fourth aspect of the present invention may be configured in that, when the average value of the first and second wave height values is less than a given minimum value, the arithmetic operation section determines that a fault is occurring in the insulation resistance detecting apparatus.

The insulation resistance detecting apparatus in a fifth aspect of the present invention may be configured in that, when the first wave height value is not less than a given maximum value, the arithmetic operation section determines that a fault is occurring in the insulation resistance detecting apparatus.

The insulation resistance detecting apparatus in a sixth aspect of the present invention may be configured by further comprising: a filter for allowing a signal in a given frequency band to pass therethrough, provided between the second end of the coupling capacitor and the waveform shaping section, wherein a wave height value of the periodic waveform outputted from the filter is set as the second wave height value.

In accordance with the aspect of the present invention, the insulation resistance of the load circuit is determined on the basis of both of the first wave height value as the wave height value of the waveform outputted from the waveform shaping circuit, and the second wave height value as the wave height value of the periodic waveform outputted from the periodic waveform output section. In this case, when the insulation resistance of the load circuit is reduced, the first wave height value approaches almost 0 V, and the second wave height value approaches a value higher than 0 V. Consequently, by using both of the first and second wave height values, it is possible to easily discern whether the reduction in the first wave height value results from the reduction in the insulation resistance or the fault such as the short circuit to a ground side in the insulation resistance detecting apparatus. Specifically, when a fault occurs such as when an arbitrary point of the insulation resistance detecting apparatus shorts out to the ground side, or when an open fault of a circuit component occurs, each of the first and second wave height values is reduced to about 0 V. In contrast to this, when the insulation resistance is reduced (e.g., when the insulation resistance is reduced to about 0Ω), the first wave height value is reduced to almost 0 V, but the second wave height value is reduced only to higher than 0 V. Consequently, on the basis of the differences described above, it is possible to discern between the reduction in the insulation resistance of the load circuit and the fault in the insulation resistance detecting apparatus itself to perform detection.

In accordance with the second aspect of the present invention, when the first wave height value is smaller than the given threshold value, the insulation resistance of the load circuit is determined on the basis of the average value of the first and second wave height values. Herein, since the first wave height value is higher than the second wave height value in the change amount of the wave height value with respect to the change of the insulation resistance, when the first wave height value is not less than the threshold value, it becomes possible to detect the insulation resistance with high precision by, e.g., determining the insulation resistance of the load circuit using only the first wave height value. In addition, when the first wave height value is less than the threshold value, the insulation resistance of the load circuit is determined on the basis of the average value of the first and second wave height values. As described above, when the insulation resistance of the load circuit is reduced, the first wave height value approaches almost 0 V, and the second wave height value approaches the value higher than 0 V (e.g., B V in FIG. 2 described later) so that the average value thereof is not reduced to 0 V. Consequently, it is possible to discern between the reduction in the insulation resistance of the load circuit and the fault in the insulation resistance detecting apparatus to perform detection.

In accordance with the third aspect of the present invention, when the first wave height value is smaller than the second wave height value, the insulation resistance of the load circuit is determined on the basis of the average value of the first and second wave height values. Herein, when the insulation resistance of the load circuit is reduced to be less than a given insulation resistance, the first wave height value becomes lower than the second wave height value. Consequently, similarly to the second aspect of the present invention, by setting the wave height value when the first and second wave height values match with each other as the threshold value described in the second aspect of the present invention, it is possible to discern between the reduction in the insulation resistance of the load circuit and the fault in the insulation resistance detecting apparatus to perform detection.

In accordance with the fourth aspect of the present invention, when the average value of the first and second wave height values is less than the given minimum value (e.g., A V in FIG. 4 described later), it is determined that the fault is occurring in the insulation resistance detecting apparatus of the load circuit. As described above, when the insulation resistance of the load circuit is reduced, the average value is not reduced to be less than the minimum value so that it is possible to judge that the fault is occurring in the insulation resistance detecting apparatus when the average value becomes less than the minimum value.

In accordance with the fifth aspect of the present invention, when the first wave height value is not less than the given maximum value, it is determined that the fault is occurring in the insulation resistance detecting apparatus of the load circuit. Specifically, when the insulation resistance of the load circuit becomes the maximum value, the first wave height value becomes a constant value less than the maximum value, and dose not rise to the value not less than the maximum value. Consequently, when the first wave height value becomes not less than the maximum value, it is possible to judge that the insulation resistance detecting apparatus has shorted out to the power source side.

In accordance with the sixth aspect of the present invention, the wave height value of the periodic waveform outputted from the filter which allows the signal in the given frequency band to pass therethrough is set as the second wave height value. Since the output from the filter has the sinusoidal waveform having one peak point, it is possible to easily set the second wave height value.

Embodiment

A description will be given hereinbelow of an embodiment of the present invention with reference to the drawings. FIG. 1 is a circuit diagram showing a load circuit including an insulation resistance detecting apparatus according to the embodiment of the present invention.

As shown in FIG. 1, a load circuit 10 is a motor drive circuit provided in, e.g., an electric vehicle or a hybrid vehicle, and an insulation resistance detecting apparatus 50 is connected to the load circuit 10. The load circuit 10 includes a direct current power source B, a converter 11 for increasing and decreasing a direct current voltage, an inverter 12 for performing DC/AC conversion, a motor 13, and a generator 14. When the motor 13 is driven, the direct current voltage outputted from the direct current power source B is increased in the converter 11, further converted to a three-phase alternating current voltage in the inverter 12, and supplied to the motor 13. On the other hand, the voltage generated in the generator 14 is converted to the direct current voltage, and then decreased to be supplied to the direct current power source B, whereby the direct current power source B is charged.

The insulation resistance detecting apparatus 50 includes a coupling capacitor C1, a rectangular wave generating circuit (periodic waveform output section) 51, a filter 53, a waveform shaping circuit (waveform shaping section) 54, and a microcomputer 55 (arithmetic operation section). One end (first end) of the coupling capacitor C1 is connected to a point P1 as one output terminal of the direct current power source B provided in the load circuit 10, while the other end (second end) thereof is connected to a point P2 as an output terminal of the rectangular wave generating circuit 51.

The rectangular wave generating circuit 51 outputs a rectangular wave as a rectangular periodic waveform on the basis of a pulse command signal outputted from the microcomputer 55.

The filter 53 is provided between the point P2 of the coupling capacitor C1 and the waveform shaping circuit 54, and allows only a signal in a given frequency band to pass therethrough to transform the waveform of the rectangular wave into a sinusoidal waveform.

Specifically, as shown in FIG. 3A, a waveform obtained by half-wave rectifying the sinusoidal wave is formed. Subsequently, a signal having this waveform (hereinbelow, the signal is referred to as a standard signal V2) is outputted to the waveform shaping circuit 54 and the microcomputer 55.

The waveform shaping circuit 54 shapes the standard signal V2 outputted from the filter 53 to generate a waveform obtained by enlarging a region in the vicinity of a peak point of the standard signal V2. Specifically, as shown in FIG. 3B, the waveform of the standard signal V2 is cut off at a given voltage Vc, and only the remaining waveform (waveform of a portion with a voltage larger than the voltage Vc) is enlarged by a desired scale factor to generate a waveform as shown in FIG. 3C. Then, a signal having this waveform (hereinbelow, this signal is referred to as a reference signal V1) is outputted to the microcomputer 55.

Herein, when the standard signal V2 shown in FIG. 3A and the reference signal V1 shown in FIG. 3C are compared with each other, the reference signal V1 changes with a range of change larger than that of the standard signal V2. Specifically, the reference signal V1 is a signal which changes more responsively than the standard signal V2.

The microcomputer 55 determines an insulation resistance Ri of the load circuit 10 on the basis of the reference signal V1 outputted from the waveform shaping circuit 54 and the standard signal V2 outputted from the filter 53. When the insulation resistance Ri of the load circuit 10 is large (normal case), the voltage at the point P2 is high so that the wave height values of the reference signal V1 and the standard signal V2 are high values. On the other hand, when the insulation resistance Ri of the load circuit 10 is reduced, the voltage at the point P2 is reduced so that the wave height values of the reference signal V1 and the standard signal V2 are reduced.

Next, with reference to FIGS. 2 and 4, a description will be given of a relationship among the insulation resistance Ri of the load circuit 10, the reference signal V1, and the standard signal V2.

Figure 2:
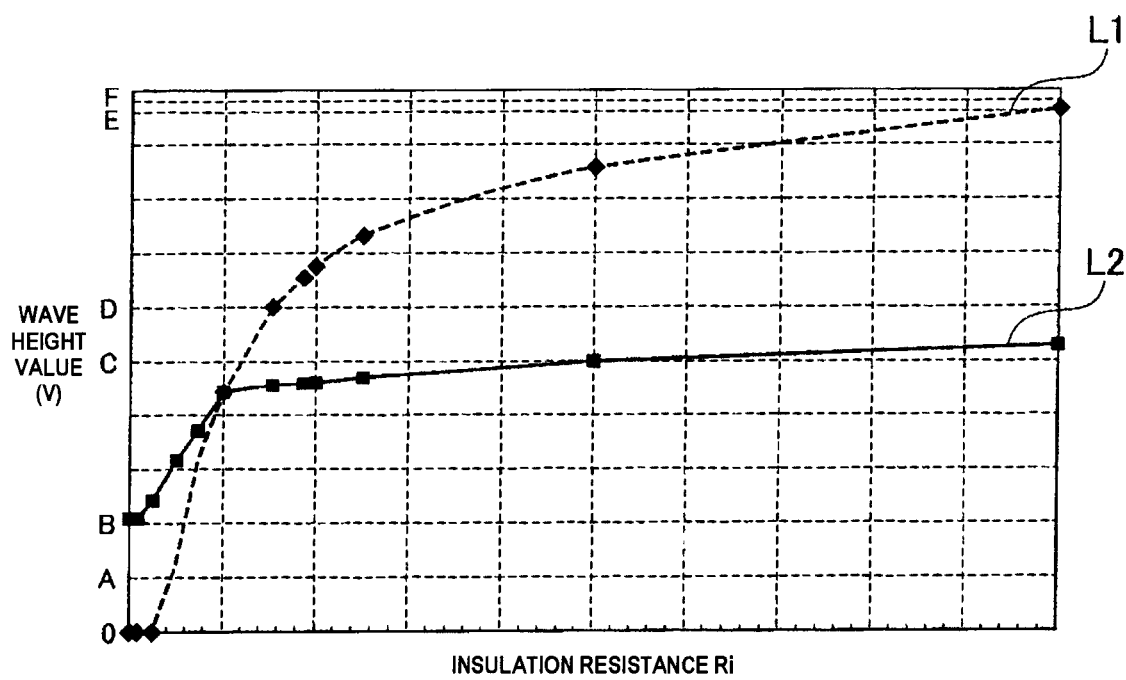
FIG. 2 is a characteristic view showing a relationship between an insulation resistance of the load circuit and wave height values of a reference signal and a standard signal according to the embodiment of the present invention.

A (broken) curve L1 shown in FIG. 2 represents a characteristic showing the relationship between the insulation resistance Ri and the wave height value of the reference signal V1 (first wave height value). A (solid) curve L2 represents a characteristic showing the relationship between the insulation resistance Ri and the wave height value of the standard signal V2 (second wave height value).

In addition, FIG. 4 is an enlarged view of the vicinity of a point where the curves L1 and L2 in FIG. 2 intersect each other. As shown in FIG. 2, the wave height value of the curve L1 changes in accordance with the magnitude of the insulation resistance Ri. Specifically, as the insulation resistance Ri increases, the wave height value of the reference signal V1 (first wave height value) monotonically increases, when the insulation resistance Ri is in the vicinity of 0Ω, the wave height value thereof is almost 0 V, and when the insulation resistance Ri approaches the maximum value, the wave height value thereof converges to about E V shown in FIG. 2.

In addition, similarly to the curve L1, the wave height value of the curve L2 (second wave height value) also changes in accordance with the magnitude of the insulation resistance Ri. Specifically, as the insulation resistance Ri increases, the wave height value of the standard signal V2 monotonically increases, when the insulation resistance Ri is in the vicinity of 0Ω, the wave height value thereof is almost 1 V (i.e., B V), and when the insulation resistance Ri approaches the maximum value, the wave height value thereof converges to about C V shown in FIG. 2. Consequently, as described above, it can be said that the reference signal V1 changes more responsively to the change of the insulation resistance Ri than the standard signal V2.

Further, when a short circuit fault to a ground occurs in the insulation resistance detecting apparatus 50 (e.g., when the short circuit fault such as the point P2 being connected to the ground occurs), each of the wave height values of the reference signal V1 and the standard signal V2 is reduced to almost 0 V.

Furthermore, when the short circuit fault to a power source side occurs in the insulation resistance detecting apparatus 50 (e.g., the short circuit fault such as the point P2 being connected to the terminal on the power source side occurs), each of the wave height values of the reference signal V1 and the standard signal V2 rises to almost 5 V (i.e. the voltage of the battery). In addition, a curve L3 shown in FIG. 4 indicates an average value of the curves L1 and L2 at the insulation resistance lower than the insulation resistance at the point (p1) where the curves L1 and L2 intersect each other.

In view of the foregoing, conditions (a) to (c) shown below are set.

(a) When the wave height value of the standard signal V2 (second wave height value) is reduced to be less than 1 V, the short circuit fault to the ground or an open fault of a component (e.g., a component constituting the filter is interrupted) is occurring in the insulation resistance detecting apparatus 50.

(b) When the wave height value of the reference signal V1 (first wave height value) rises to about 5 V, the short circuit fault to the power source side is occurring in the insulation resistance detecting apparatus 50.

(c) Since the reference signal V1 is larger than the standard signal V2 in the change amount with respect to the change of the insulation resistance Ri, it is possible to determine the insulation resistance Ri more precisely by using the wave height value of the reference signal V1 than by using that of the standard signal V2, and in turn detect the occurrence of electric leakage with higher precision.

In the present embodiment, in order to detect the above-mentioned condition (b), a maximum threshold value Vth3 (e.g., Vth3=F V in FIG. 2) is set for the wave height value of the reference signal V1 and, when the wave height value of the reference signal V1 exceeds the maximum threshold value Vth3, it is determined that the short circuit fault to the power source side is occurring.

In addition, on the basis of the above-mentioned conditions (a) and (c), when V2≦V1 is satisfied (in a region where the insulation resistance Ri is not less than the insulation resistance Ri at the point p1 in FIG. 4), the insulation resistance is determined on the basis of the reference signal V1 and, when V2>V1 is satisfied (in a region where the insulation resistance Ri is smaller than the insulation resistance Ri at the point p1), the insulation resistance Ri is determined on the basis of the average value of V1 and V2. Specifically, in a case where only V1 is used, it is not possible to determine whether the fault is occurring in the insulation resistance detecting apparatus 50 itself, or the insulation resistance Ri is reduced to an extremely low value when V1 is reduced to be in the vicinity of 0 V. On the other hand, in a case where only V2 is used, it is not possible to perform the detection with high precision since the change amount of V2 with respect to the change of the insulation resistance Ri is small.

Consequently, in a region where V2>V1 is satisfied, the drawbacks of both of the cases are compensated by using the average value of V1 and V2 (curve L3). In this case, when the average value of V1 and V2 becomes less than A V shown in FIG. 4, it is determined that the fault is occurring in the insulation resistance detecting apparatus 50.

Specifically, the microcomputer 55 determines the insulation resistance Ri of the load circuit 10 by using the curve L1 indicative of the wave height value of the reference signal V1 and the curve L3 indicative of the average value of the wave height values of the reference signal V1 and the standard signal V2 and, when the short circuit fault or the open fault of the component occurs in the insulation resistance detecting apparatus 50, the microcomputer 55 detects the fault.

Figure 5:
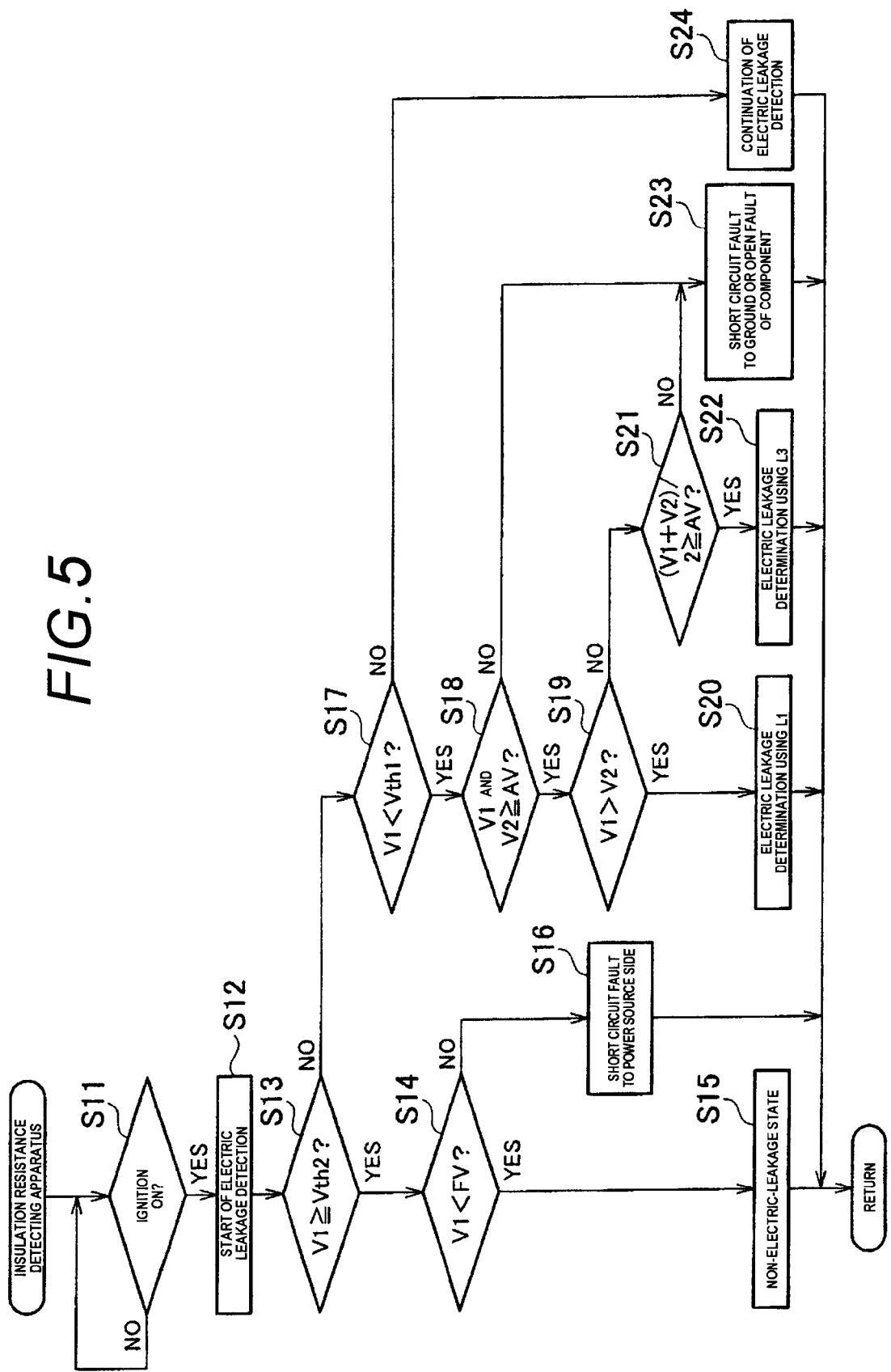
FIG. 5 is a flow chart showing a process operation of the insulation resistance detecting apparatus according to the embodiment of the present invention.
Figure 6:
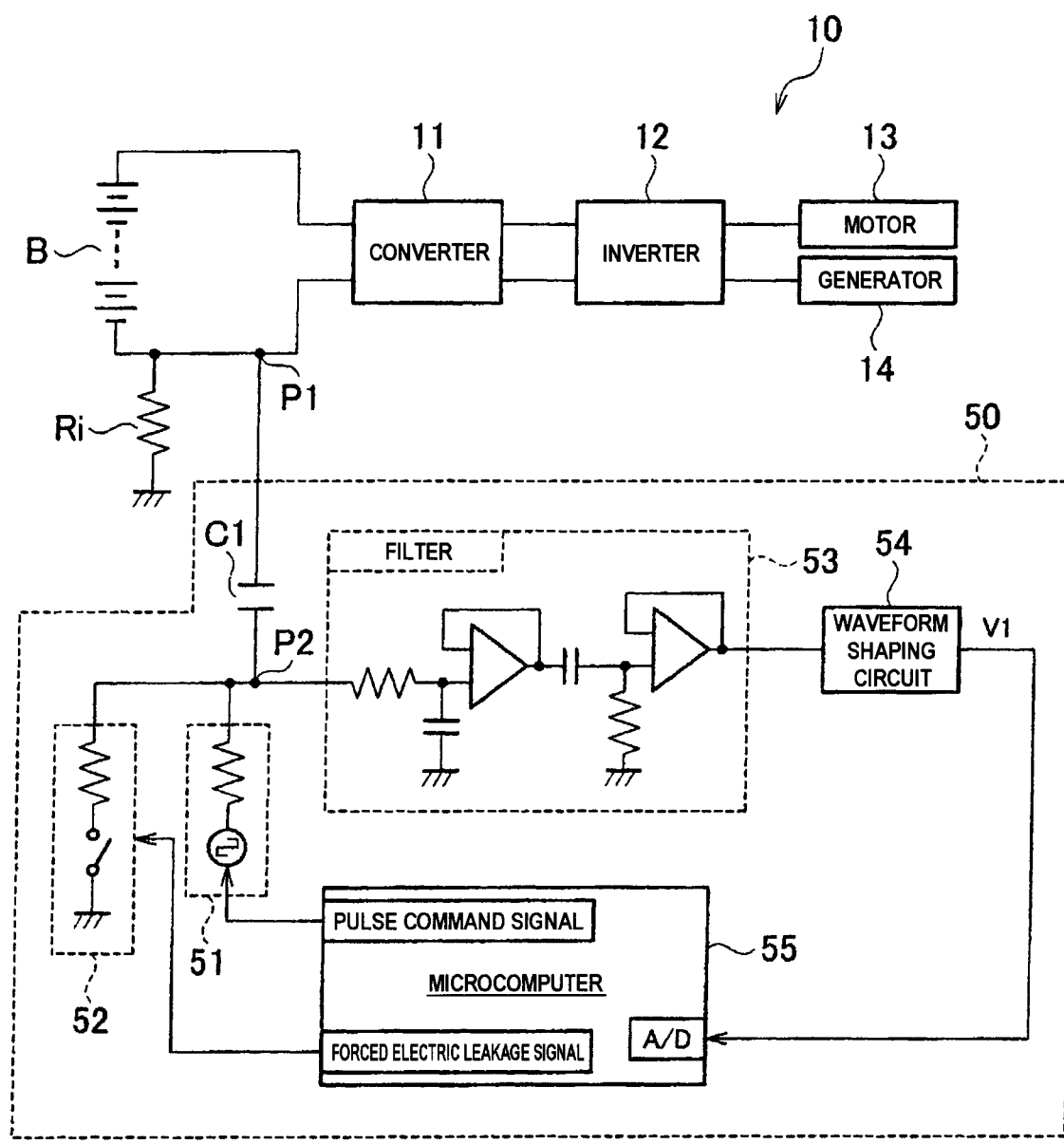
FIG. 6 is a circuit diagram showing a structure when an insulation resistance detecting apparatus is connected to the load circuit in a conventional case.
Figure 7:
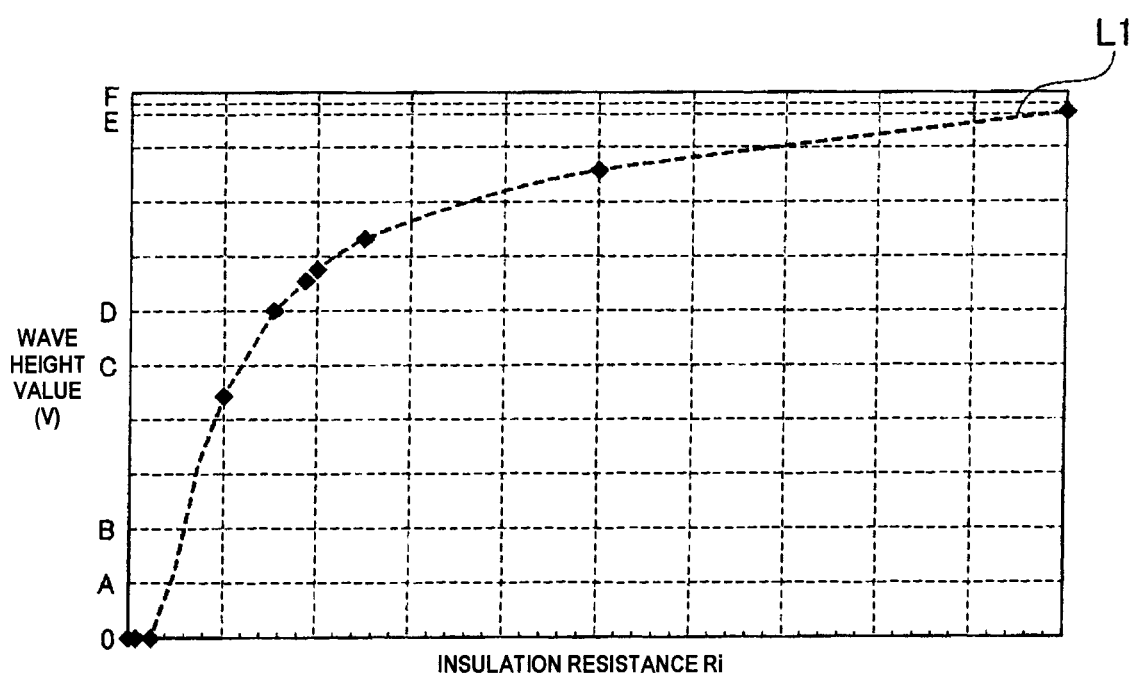
FIG. 7 is a characteristic view showing the relationship between the insulation resistance of the load circuit and the wave height value of the reference signal in the conventional case.

Next, a description will be given of an operation of the insulation resistance detecting apparatus according to the embodiment of the present invention with reference to a flow chart shown in FIG. 5.

Firstly, the microcomputer 55 of the insulation resistance detecting apparatus 50 determines whether or not an ignition of a vehicle is turned on (step S11).

When determining that the ignition of the vehicle is turned on, the microcomputer 55 starts electric leakage detection for performing electric leakage monitoring and fault detection of the insulation resistance detecting apparatus 50 (step S12). In the present embodiment, the electric leakage monitoring and the fault detection of the insulation resistance detecting apparatus 50 are performed at any time when the ignition of the vehicle is on.

Thereafter, the microcomputer 55 determines whether or not V1≧Vth2 is satisfied (step S13). Specifically, the microcomputer 55 determines whether or not the reference signal V1 outputted from the waveform shaping circuit 54 is not less than an electric leakage clear threshold value Vth2 (e.g., D V in FIG. 2).

When determining that V1≧Vth2 is satisfied, the microcomputer 55 determines whether or not V1<F V shown in FIG. 2 is satisfied (step S14).

When determining that V1<F V is satisfied, the microcomputer 55 determines a non-electric-leakage state where the electric leakage is not occurring in the load circuit 10 (step S15).

On the other hand, when determining that V1<F V is not satisfied in the process of the step S14 (NO in the step S14), the microcomputer 55 determines a short circuit fault state to the power source side (step S16). As described above, when the insulation resistance Ri is the maximum value, the wave height value of the reference signal V1 is about E V shown in FIG. 2, and is not increased any more. Consequently, when V1≧F V (F V corresponds to the maximum threshold value Vth3) is satisfied, it is determined that the insulation resistance detecting apparatus 50 has shorted out to the power source side.

When determining that V1≧Vth2 is not satisfied in the process of the step S13 (NO in the step S13), the microcomputer 55 determines whether or not the reference signal V1 is less than an electric leakage detection threshold value Vth1 (e.g., C V in FIG. 2) (step S17). Subsequently, when determining that V1<Vth1 is not satisfied (NO in the step S17), the microcomputer 55 continues the electric leakage detection (step S24). Specifically, when the reference signal V1 is in the range between the electric leakage detection threshold value Vth1 and the electric leakage clear threshold value Vth2, the microcomputer 55 determines that the electric leakage is not occurring in the load circuit 10, and the fault is not occurring in the insulation resistance detecting apparatus 50 to continue the electric leakage detection.

On the other hand, when determining that V1<Vth1 is satisfied, the microcomputer 55 determines whether or not V1 and V2≧A V is satisfied (step S18). Specifically, the microcomputer 55 determines whether or not each of the reference signal V1 outputted from the waveform shaping circuit 54 and the standard signal V2 outputted from the filter 53 is not less than A V shown in FIG. 2.

When determining that V1 and V2<A V is satisfied in the process of the step S18 (NO in the step S18), the microcomputer 55 detects the occurrence of the short circuit fault to the ground or the open fault of the component in the insulation resistance detecting apparatus 50 (step S23).

When determining that V1 and V2≧A V is satisfied, the microcomputer 55 determines whether or not V1≧V2 is satisfied (step S19).

When determining that V1≧V2 is satisfied, the microcomputer 55 determines that the insulation resistance Ri is not less than that at the intersection point p1, and performs an electric leakage determination (detection of the insulation resistance Ri) using only the reference signal V1, i.e., the electric leakage determination using the curve L1 shown in FIG. 4 (step S20).

On the other hand, when determining that V1≧V2 is not satisfied in the process of the step S19 (NO in the step S19), the microcomputer 55 determines whether or not (V1+V2)/2≧A V is satisfied (step S21). In this process, the microcomputer 55 determines that the insulation resistance Ri of the load circuit 10 is less than that at the intersection point p1 shown in FIG. 4.

When determining that (V1+V2)/2≧A V is satisfied, the microcomputer 55 performs the electric leakage determination (determination of the insulation resistance Ri) using the average value of the reference signal V1 and the standard signal V2, i.e., the electric leakage determination using the curve L3 shown in FIG. 4 (step S22).

On the other hand, when determining that (V1+V2)/2≧A V is not satisfied in the process of the step S21 (NO in the step S21), the microcomputer 55 determines the short circuit fault to the ground or the open fault of the component in the insulation resistance detecting apparatus 50 (step S23). Specifically, as described above, when the insulation resistance Ri of the load circuit 10 is reduced to about 0Ω, the reference signal V1 is reduced to about 0 V, but the standard signal V2 is reduced only to 1 V so that the average value of the reference signal V1 and the standard signal V2 does not become less than A V shown in FIG. 4 when the electric leakage is occurring in the load circuit 10. In contrast to this, when the short circuit fault to the ground or the open fault of the component is occurring in the insulation resistance detecting apparatus 50, each of the reference signal V1 and the standard signal V2 is reduced to about 0 V so that the average value of the reference signal V1 and the standard signal V2 can be less than A V shown in FIG. 4. Consequently, when the condition in the step S21 is satisfied, it is determined that the electric leakage is occurring in the load circuit 10, while when the condition is not satisfied, it is determined that the fault is occurring in the insulation resistance detecting apparatus 50.

As described above, when the reference signal V1 is smaller than the standard signal V2, the microcomputer 55 determines the insulation resistance Ri of the load circuit 10 on the basis of the average value of the curve L1 indicative of the relationship with the reference signal V1 and the curve L2 indicative of the relationship with the standard signal V2. Accordingly, it is possible to discern whether the short circuit trouble is occurring in the load circuit 10 or the short circuit fault is occurring in the insulation resistance detecting apparatus 50 itself.

Thus, the insulation resistance detecting apparatus according to the present embodiment has the coupling capacitor C1 of which the first end (P1) is connected to the load circuit 10, the rectangular wave generating circuit 51 which is connected to the second end (P2) of the coupling capacitor C1, and outputs the periodic waveform to the second end, the waveform shaping circuit 54 which extracts and amplifies a part of the periodic waveform including the peak point, and the microcomputer 55 which determines the insulation resistance Ri of the load circuit 10 on the basis of the reference signal V1 (first wave height value) as the wave height value of the waveform outputted from the waveform shaping circuit 54 and the standard signal V2 (second wave height value) as the wave height value of the periodic waveform. Consequently, in this case, when the insulation resistance of the load circuit is reduced, the reference signal V1 approaches almost 0 V, and the standard signal V2 approaches the value higher than 0 V (e.g., B V in FIG. 2). Accordingly, by using both of the reference signal V1 and the standard signal V2, it is possible to easily discern whether the reduction in the reference signal V1 results from the reduction in the insulation resistance Ri or the fault such as the short circuit to the ground side in the insulation resistance detecting apparatus 50 or the like. Specifically, when the fault occurs such as when an arbitrary point in the insulation resistance detecting apparatus 50 shorts out to the ground side, or when the open fault of the component constituting the circuit occurs, each of the reference signal V1 and the standard signal V2 is reduced to about 0 V. In contrast to this, when the insulation resistance Ri is reduced (e.g., when the insulation resistance Ri is reduced to about 0Ω), the reference signal V1 is reduced to almost 0 V, but the standard signal V2 is reduced only to about B V shown in FIG. 2. Consequently, on the basis of the differences, it is possible to discern between the reduction in the insulation resistance Ri of the load circuit 10 and the fault in the insulation resistance detecting apparatus 50 itself to perform detection.

As a result, it is possible to reliably detect the apparatus fault which occurs when the insulation resistance detecting apparatus 50 is driven, and omit the conventionally used self-diagnosis circuit.

In addition, when the reference signal V1 is smaller than the electric leakage detection threshold value Vth1 (e.g., C V shown in FIG. 2), the microcomputer 55 determines the insulation resistance Ri of the load circuit 10 on the basis of the average value (curve L3) of the reference signal V1 and the standard signal V2. Herein, since the reference signal V1 is higher than the standard signal V2 in the change amount of the wave height value with respect to the change of the insulation resistance Ri, when the reference signal V1 is not less than the electric leakage detection threshold value Vth1, it becomes possible to detect the insulation resistance Ri with high precision by, e.g., determining the insulation resistance Ri of the load circuit 10 using only the reference signal V1. Further, when the reference signal V1 is less than the electric leakage detection threshold value Vth1, the insulation resistance Ri of the load circuit 10 is determined on the basis of the average value of the reference signal V1 and the standard signal V2. As described above, when the insulation resistance Ri of the load circuit 10 is reduced, the reference signal V1 approaches almost 0 V, and the standard signal V2 approaches the value higher than 0 V (e.g., B V in FIG. 2) so that the average value thereof is about A V shown in FIG. 4, and is not reduced to 0 V. Because of this, it is possible to discern between the reduction in the insulation resistance Ri of the load circuit 10 and the fault in the insulation resistance detecting apparatus 50 to perform detection.

Furthermore, when the reference signal V1 is smaller than the standard signal V2, the microcomputer 55 determines the insulation resistance Ri of the load circuit 10 on the basis of the average value (curve L3) of the reference signal V1 and the standard signal V2. Herein, when the insulation resistance Ri of the load circuit 10 is reduced to be less than the given insulation resistance (less than the insulation resistance at the intersection point p1 shown in FIG. 4), the reference signal V1 becomes less than the standard signal V2. Consequently, similarly to the second aspect of the present invention described above, by setting the wave height value when the reference signal V1 and the standard signal V2 match with each other as the threshold value (electric leakage detection threshold value Vth1) described in the second aspect of the present invention, it is possible to discern between the reduction in the insulation resistance Ri of the load circuit 10 and the fault in the insulation resistance detecting apparatus 50 to perform detection.

Moreover, when the average value of the reference signal V1 and the standard signal V2 is less than the given minimum value (e.g., A V in FIG. 4), the microcomputer 55 determines that the fault is occurring in the insulation resistance detecting apparatus 50 of the load circuit 10. As described above, when the insulation resistance Ri of the load circuit 10 is reduced, the average value (curve L3) is not reduced to be less than the minimum value (e.g., A V in FIG. 4) so that it is possible to judge that the fault is occurring in the insulation resistance detecting apparatus 50 when the average value becomes less than the minimum value.

Additionally, when the reference signal V1 is not less than the given maximum value (e.g., Vth3=F V in FIG. 2), the microcomputer 55 determines that the fault is occurring in the insulation resistance detecting apparatus 50 of the load circuit 10. Specifically, when the insulation resistance of the load circuit 10 becomes the maximum value, the reference signal V1 becomes the constant value less than the maximum value (F V), and does not rise to the value not less than the maximum value. Accordingly, when the reference signal V1 becomes not less than the maximum value, it is possible to judge that the insulation resistance detecting apparatus 50 has shorted out to the power source side.

The insulation resistance detecting apparatus 50 according to the present embodiment sets the wave height value of the periodic waveform outputted from the filter 53 which allows the signal in the given frequency band to pass therethrough as the standard signal V2. Since the output of the filter 53 has the sinusoidal waveform, and the waveform has one peak point, it is possible to easily set the standard signal V2.

Although the description has been given thus far of the insulation resistance detecting apparatus of the present invention on the basis of the embodiment shown in the drawings, the present invention is not limited thereto, and the structure of each component can be replaced with an arbitrary structure having the same function.

For example, in the above-described embodiment, the description has been given of the case where the microcomputer 55 determines that the fault is occurring in the insulation resistance detecting apparatus 50 when the average value of the reference signal V1 and the standard signal V2 is less than A V (given minimum value) shown in FIG. 4. However, the given minimum value may be appropriately changed.

In addition, in the above-described embodiment, the description has been given of the case where the microcomputer 55 determines that the fault is occurring in the insulation resistance detecting apparatus 50 when the reference signal V1 is not less than F V (given maximum value) shown in FIG. 2. However, the given maximum value may be appropriately changed.

The present invention is extremely useful in detecting a reduction in an insulation resistance of a load circuit and a fault in a apparatus which are provided in an electric vehicle and a hybrid vehicle.

What is claimed is:

1. An insulation resistance detecting apparatus for detecting an insulation resistance of a load circuit, the apparatus comprising:
   a coupling capacitor of which a first end is connected to the load circuit;
   a periodic waveform output section which is connected to a second end of the coupling capacitor, and outputs a periodic waveform to the second end;
   a waveform shaping section which extracts and amplifies a part of the periodic waveform including a peak point, outputted from the periodic waveform output section; and
   an arithmetic operation section which is connected to the periodic waveform output section and the waveform shaping section and determines the insulation resistance of the load circuit on the basis of a first peak value of a waveform outputted from the waveform shaping section and a second peak value, substantially at a same timing as a timing at which the first peak value is obtained, of the periodic waveform outputted from the periodic waveform output section.

2. The insulation resistance detecting apparatus according to claim 1, wherein, when the first peak value is smaller than a given threshold value, the arithmetic operation section determines the insulation resistance on the basis of an average value of the first and second peak values.

3. The insulation resistance detecting apparatus according to claim 1, wherein, when the first peak value is smaller than the second peak value, the arithmetic operation section determines the insulation resistance on the basis of an average value of the first and second peak values.

4. The insulation resistance detecting apparatus according to claim 2, wherein, when the average value of the first and second peak values is less than a given minimum value, the arithmetic operation section determines that a fault is occurring in the insulation resistance detecting apparatus.

5. The insulation resistance detecting apparatus according to claim 3, wherein, when the average value of the first and second peak values is less than a given minimum value, the arithmetic operation section determines that a fault is occurring in the insulation resistance detecting apparatus.

6. The insulation resistance detecting apparatus according to claim 1, wherein, when the first peak value is not less than a given maximum value, the arithmetic operation section determines that a fault is occurring in the insulation resistance detecting apparatus.

7. The insulation resistance detecting apparatus according to claim 1, further comprising:
   a filter for allowing a signal in a given frequency band to pass therethrough, provided between the second end of the coupling capacitor and the waveform shaping section, wherein a peak value of the periodic waveform outputted from the filter is set as the second peak value.

8. The insulation resistance detecting apparatus according to claim 1, wherein an output of the periodic waveform output section is branched off into at least two paths, wherein one path is connected to the waveform shaping section, and another path bypasses the waveform shaping section and is connected to the arithmetic operation section.

* * * * *